United States Patent
Moriya et al.

(10) Patent No.: US 7,416,635 B2
(45) Date of Patent: Aug. 26, 2008

(54) GAS SUPPLY MEMBER AND PLASMA PROCESSING APPARATUS

(75) Inventors: Tsuyoshi Moriya, Nirasaki (JP); Takahiro Murakami, Miyagi-gun (JP)

(73) Assignee: Tokyo Electron Limited, Tokyo (JP)

( * ) Notice: Subject to any disclaimer, the term of this patent is extended or adjusted under 35 U.S.C. 154(b) by 28 days.

(21) Appl. No.: 11/365,509

(22) Filed: Mar. 2, 2006

(65) Prior Publication Data

US 2006/0196604 A1  Sep. 7, 2006

Related U.S. Application Data

(60) Provisional application No. 60/662,794, filed on Mar. 18, 2005.

(30) Foreign Application Priority Data

Mar. 2, 2005  (JP) ............................. 2005-057673

(51) Int. Cl.
*H01L 21/3065* (2006.01)
*C23C 16/00* (2006.01)
*C23C 16/50* (2006.01)
*C23C 16/455* (2006.01)

(52) U.S. Cl. ................. 156/345.34; 156/345.33; 118/715

(58) Field of Classification Search ........... 118/715; 156/345.33, 345.34

See application file for complete search history.

(56) References Cited

U.S. PATENT DOCUMENTS

| 4,854,263 | A | * | 8/1989 | Chang et al. ............ 118/715 |
| 5,589,002 | A | * | 12/1996 | Su ..................... 118/723 E |
| 2003/0140851 | A1 | * | 7/2003 | Janakiraman et al. ..... 118/715 |
| 2006/0196604 | A1 | * | 9/2006 | Moriya et al. .......... 156/345.34 |

FOREIGN PATENT DOCUMENTS

KR       2001-0083348       9/2001

* cited by examiner

*Primary Examiner*—Jeffrie R Lund
(74) *Attorney, Agent, or Firm*—Oblon, Spivak, McClelland, Maier & Neustadt, P.C.

(57) ABSTRACT

A gas supply member is disposed in a chamber of a plasma processing apparatus and has a planar surface facing an inner space of the chamber and a plurality of gas holes bored in the planar surface to supply a gas through the gas holes to the inner space. An outer periphery portion of each gas hole at the planar surface has a slant surface formed to correspond to a flow of the gas injected through each gas hole. Further, the slant surface includes at least any one of a flat surface and a curved surface. An angle formed between the slant surface and the planar surface is equal to or greater than that formed between the planar surface and a distribution of the gas injected through each gas hole.

12 Claims, 8 Drawing Sheets

20°   P   20°

20°   P   20°

20°   P   20°

20°   P   20°

GAS SUPPLY MEMBER AND PLASMA PROCESSING APPARATUS

CROSS-REFERENCE TO RELATED APPLICATIONS

This document claims priority to Japanese Patent Application Number 2005-57673, filed Mar. 2, 2005 and U.S. Provisional Application No. 60/662,794, filed Mar. 18, 2005, the entire content of which are hereby incorporated by reference.

FIELD OF THE INVENTION

The present invention relates to a gas supply member and a plasma processing apparatus.

BACKGROUND OF THE INVENTION

In general, a plasma processing apparatus for performing a predetermined plasma processing on a substrate, such as a semiconductor wafer, a flat display panel or the like, includes an accommodation chamber (hereinafter, referred to as a "chamber") for accommodating therein the substrate. In the plasma processing apparatus, a processing gas is introduced into the chamber through a gas introduction shower head functioning as a gas supply member and a high frequency power is applied thereto to produce a plasma from the processing gas, wherein the plasma is used in performing a plasma processing on the substrate.

A portion facing the chamber (to be referred as a "chamber-facing portion" hereinafter) of the gas introduction shower head is normally made of a flat plate having a plurality of gas holes for injecting the processing gas. However, when the high frequency power is applied to the chamber, an electric field tends to be concentrated at an outer periphery portion of a gas hole of the gas introduction shower head, which may cause an abnormal discharge. Such an abnormal discharge incurs damage on the substrate or constituent components disposed in the chamber. Specifically, crack, notch or the like may be developed on a surface of a semiconductor wafer employed as the substrate, or the constituent component may be damaged.

Thus, there has been known in the conventional plasma processing apparatus that a curved surface is formed at the outer periphery portion of the gas injection hole to prevent the concentration of the electric field and the abnormal discharge (e.g., see Japanese Patent Laid-open Application No. S59-4011).

Since, however, there are planar portions between gas holes in the chamber-facing portion of the gas introduction shower head of the conventional plasma processing apparatus, a flow of the processing gas injected through the gas holes is abated in the middle portions between the gas holes where the planar portions exist, so that the processing gas remains stagnant thereat. Particles produced in the chamber move towards where a gas viscous force caused by collisions with gas molecules of the processing gas injected through the gas holes, an ion viscous force caused by collisions with ions and an electrostatic force applied thereto are balanced with each other (FIGS. 8 and 9). Therefore, the particles are left stagnant in the middle portions between the gas holes, where the flow of the processing gas is abated and thus the gas viscous force becomes weak. Further, since radicals serving as precursors also remain stagnant in the middle portions between the gas holes as in the case of the particles, deposits are likely to be made on the middle portions and then peeled off therefrom to become foreign substances adhering on the semiconductor wafer. Moreover, accumulation of deposits may lead to changes in the reaction process in the chamber (memory effect).

SUMMARY OF THE INVENTION

It is, therefore, an object of the present invention to provide a gas supply member and a plasma processing apparatus capable of supplying a gas into a chamber without having it remain stagnant.

To achieve the object, in accordance with the present invention, there is provided a gas supply member, which is disposed in a chamber of a plasma processing apparatus and has a planar surface facing an inner space of the chamber and a plurality of gas holes bored in the planar surface to supply a gas through the gas holes to the inner space, wherein an outer periphery portion of each gas hole at the planar surface has a slant surface formed to correspond to a flow of the gas injected through each gas hole, and wherein the slant surface includes at least any one of a flat surface and a curved surface. Accordingly, it is possible to remove the space where the flow of the injected gas is abated, and to supply the injected gas into the chamber without leaving it to remain stagnant at middle positions between the gas holes.

In the gas supply member, the slant surface may include a coned surface, a spherical surface, a parabolic surface, or a combination thereof. Accordingly, the space where the flow of the injected gas is abated can be further removed.

In the gas supply member, an angle formed between the slant surface and the planar surface may be equal to or greater than that formed between the planar surface and a distribution of the gas injected through each gas hole. Accordingly, the space where the flow of the injected gas is abated can be surely removed.

In the gas supply member, an angle formed between the slant surface and the planar surface may be 20° or greater. Accordingly, the space where the flow of the injected gas is abated can be further surely removed.

In the gas supply member, the slant surface may have an n-fold rotation symmetry about a central axis of each gas hole. Accordingly, the space where the flow of the injected gas is abated between the gas holes can be surely removed.

In the gas supply member, a surface between neighboring gas holes may be formed of only the slant surface. Accordingly, the space where the flow of the injected gas is abated between the gas holes can be surely removed.

To achieve the object, in accordance with the present invention, there is provided a gas supply member, which is disposed in a chamber of a plasma processing apparatus and has a planar surface facing an inner space of the chamber and a plurality of gas holes bored in the planar surface to supply a gas through the gas holes to the inner space, wherein outer periphery portions of neighboring gas holes at the planar surface are connected to form grooves, wherein an outer periphery portion of each groove at the planar surface has a slant surface to correspond to a flow of the gas injected through each gas hole, and the grooves are concentrically formed on the planar surface, and wherein the slant surface includes at least any one of a flat surface and a curved surface. Therefore, the injected gas can be supplied into the chamber without being left stagnant in middle positions between the gas holes. At the same time, the gas supply member can be readily manufactured, thereby reducing the manufacturing cost thereof.

In the gas supply member, the slant surface may include a cone surface, a spherical surface, a parabolic surface, or a combination thereof.

To achieve the object, in accordance with the present invention, there is provided a gas supply member, disposed in a chamber of a plasma processing apparatus, including a planar surface facing an inner space of the chamber; and gas channels, opened at the planar surface, for supplying a gas into the inner space, wherein an outer periphery portion of each gas channel at the planar surface has a slant surface to correspond to a flow of the gas injected through each gas channel, and wherein the slant surface includes at least any one of a flat surface and a curved surface. Accordingly, it is possible to remove the space where the flow of the injected gas is abated, and to supply the injected gas into the chamber without leaving it to remain stagnant at middle positions between the gas holes.

In the gas supply member, the slant surface may include a cone surface, a spherical surface, a parabolic surface, or a combination thereof.

To achieve the object, in accordance with the present invention, there is provided a plasma processing apparatus, which includes a chamber for accommodating therein an object to be processed; and a gas supply member, disposed in the chamber, for supplying a gas into an inner space of the chamber, wherein the gas supply member has a planar surface facing the inner space, and a plurality of gas holes bored in the planar surface to supply a gas through the gas holes into the inner space; and an outer periphery portion of each gas hole at the planar surface has a slant surface to correspond to a flow of the gas injected through the gas hole, and wherein the slant surface includes at least any one of a flat surface and a curved surface.

In the plasma processing apparatus, the slant surface may include a cone surface, a spherical surface, a parabolic surface, or a combination thereof.

BRIEF DESCRIPTION OF THE DRAWINGS

The above and other objects and features of the present invention will become apparent from the following description of preferred embodiments given in conjunction with the accompanying drawings, in which:

FIG. 4A is a case where Knudsen number Kn, i.e., mean free path of gas molecule divided by nozzle diameter, is $8.93 \times 10^{-3}$; FIG. 4B, Kn=$8.93 \times 10^{-2}$; FIG. 4C, Kn=0.893; and FIG. 4D, Kn=8.93;

FIG. 7A is a case where gas holes, each having a 2 mm diameter, are disposed with a 5 mm gap therebetween; FIGS. 7B and 7C are cases where gas holes, each having a 2 mm diameter, are disposed with a 4 mm gap therebetween; FIGS. 7D and 7E are cases where gas holes, each having a 1.5 mm diameter, are disposed with a 3.5 mm gap therebetween; and FIGS. 7F and 7G are cases where, gas holes, each having a 1 mm diameter, are disposed with a 3 mm gap therebetween;

DETAILED DESCRIPTION OF THE PREFERRED EMBODIMENTS

Hereinafter, preferred embodiments of the present invention will be described with reference to the accompanying drawings.

Figure 1:
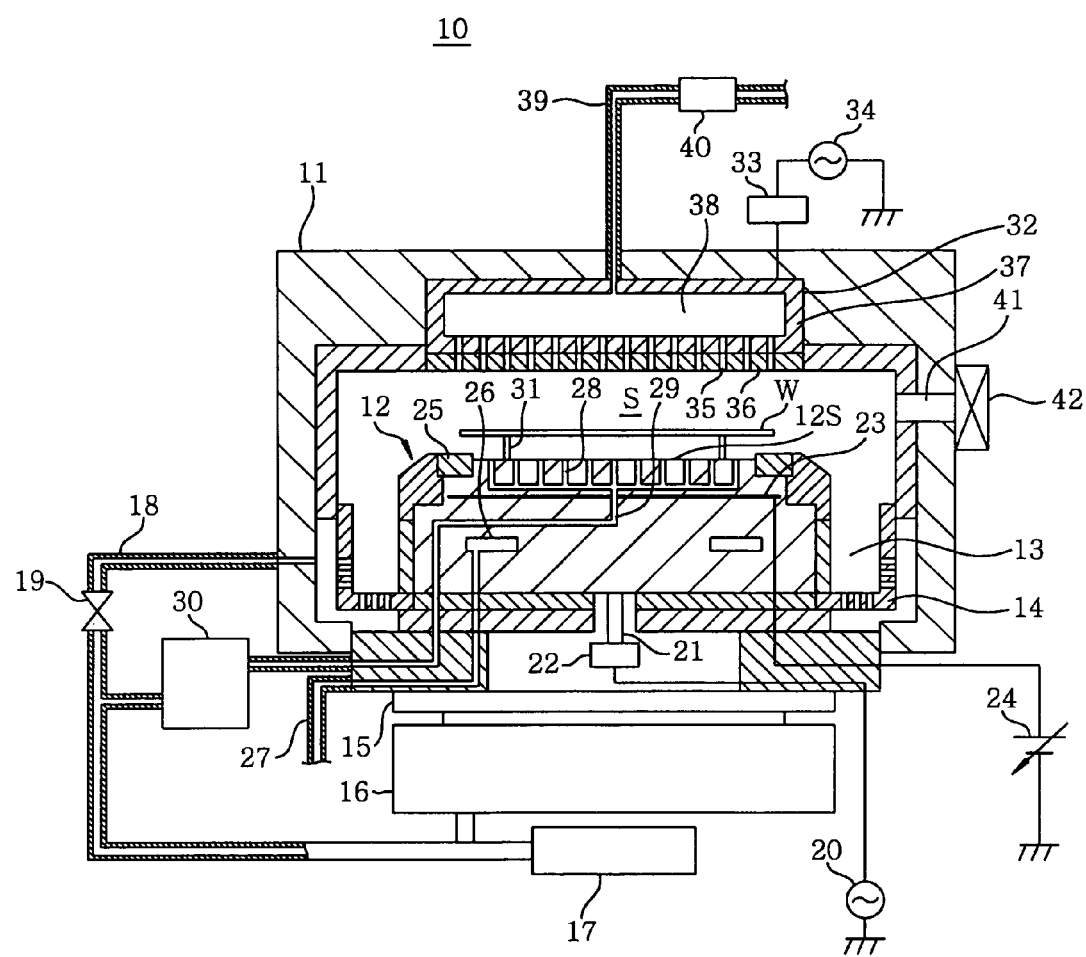
FIG. 1 offers a cross sectional view showing a schematic configuration of a plasma processing apparatus in accordance with a preferred embodiment of the present invention.

FIG. 1 is a vertical sectional view showing a schematic configuration of a plasma processing apparatus in accordance with a preferred embodiment of the present invention.

Referring to FIG. 1, a plasma processing apparatus 10 performs a dry etching, e.g., RIE (Reactive ion etching), process as a predetermined plasma processing on a wafer W to produce semiconductor devices and includes a cylindrical chamber 11 made of a metal, e.g., aluminum or stainless steel, having therein a cylindrical susceptor 12 employed as a mounting table (stage) for mounting thereon the wafer W of, e.g., 300 mm in diameter.

In the plasma processing apparatus 10, between an inner wall of the chamber 11 and a side surface of the susceptor 12, there is formed a gas exhaust passageway 13 serving as a flow path for discharging gas molecules from a space above the susceptor 12 to the outside. An annular baffle plate 14 for preventing plasma leakage is disposed in the middle of the gas exhaust passageway 13. Further, a space at the downstream side of the gas exhaust passageway 13 below the baffle plate 14 is crooked to pass below the susceptor 12 to communicate with an automatic pressure control valve (APC) 15 employed as a variable butterfly valve. The APC 15 is coupled to a turbo molecular pump (TMP) 16 employed as a gas exhaust pump for vacuum exhaust, and, further, coupled to a dry pump (DP) 17 employed as a gas exhaust pump through the TMP 16. Hereinafter, a gas exhaust channel formed by APC 15, TMP 16 and DP 17 is referred to as a "main exhaust line", which performs a pressure control in the chamber 11 by using the APC 15, and depressurizes the inside of the chamber 11 to a near-vacuum state by using the TMP 16 and the DP 17.

Further, the aforementioned space at the downstream side of the gas exhaust passageway 13 below the baffle plate 14 is also coupled to an additional gas exhaust channel (hereinafter, referred to as a "rough exhaust line"), separated from the main exhaust line. The rough exhaust line communicates with the aforementioned space and the DP 17 and includes a gas exhaust line 18 having a diameter of, e.g., 25 mm and a valve 19 disposed in the middle of the gas exhaust line 18. By using the valve 19, the aforementioned space can be isolated from the DP 17. Gases in the chamber 11 are discharged by the DP 17 through the rough exhaust line.

A lower electrode high frequency power supply 20 is connected to the susceptor 12 through a power feed rod 21 and a matching unit 22 and supplies a predetermined high frequency power to the susceptor 12. Accordingly, the susceptor 12 serves as a lower electrode. Further, the matching unit 22 functions to maximize a supply efficiency of a high frequency power supplied to the susceptor 12 by reducing the high frequency power reflected from the susceptor 12.

At an inner upper portion of the susceptor 12, there is disposed a circular electrode plate 23 made of a conductive film. A DC power supply 24 is electrically connected to the electrode plate 23. The wafer W is adsorbed and supported on a top surface of the susceptor 12 by Columbic force or Johnsen-Rahbek force generated by a DC voltage applied from the DC power supply 24 to the electrode plate 23. Further, a circular focus ring 25 is disposed on top of the susceptor 12 to surround a periphery of the wafer W, which is adsorbed and supported on the top surface of the susceptor 12. The focus ring 25 is exposed to a space S, which will be explained later, and functions to focus ions or radicals produced in the space S onto the surface of the wafer W, thereby improving an RIE processing efficiency.

Further, an annular coolant chamber 26 extending, e.g., in the circumferential direction, is provided in the susceptor 12. A coolant, e.g., cooling water, maintained at a specified temperature is supplied into the coolant chamber 26 from a chiller unit (not shown) through a coolant piping 27. Therefore, a processing temperature of the wafer W, which is adsorbed and supported on the top surface of the susceptor 12, is controlled by the temperature of the coolant.

At a part 12S on the top surface of the susceptor 12 where the wafer W is adsorbed and supported (hereinafter, referred to as an "adsorption surface"), there are formed a plurality of heat transfer gas supply holes 28 and heat transfer gas supply grooves (not shown). The heat transfer gas supply holes 28 and the heat transfer gas supply grooves are coupled to a heat transfer gas supply unit 30 through a heat transfer gas supply line 29 disposed in the susceptor 12. The heat transfer gas supply unit 30 supplies a heat transfer gas, e.g., He gas, to a gap between the adsorption surface 12S and a backside surface of the wafer W. Further, the heat transfer gas supply unit 30 is connected to the gas exhaust line 18 and configured to vacuum-exhaust the gap between the adsorption surface 12S and the backside surface of the wafer W by using the DP 17.

At the adsorption surface 12S of the susceptor 12, there is disposed a plurality of pusher pins (pressing pins) 31 serving as lift pins, which can be deliberately protruded above the top surface of the susceptor 12. These pusher pins 31, coupled to a motor (not shown) through a ball screw (not shown), move in up and down directions of FIG. 1 by a rotational movement of the motor, which is converted into a rectilinear movement by the ball screw. While the wafer W is adsorbed on the adsorption surface 12S and the RIE processing is carried out on the wafer W, the pusher pins 31 are lowered down into the susceptor 12. On the other hand, when the RIE processed wafer W is unloaded from the chamber 11, the pusher pins 31 are protruded from the top surface of the susceptor 12 to separate the wafer W from the susceptor 12 and lift it upward.

At a ceiling portion of the chamber 11, there is disposed a gas introduction shower head 32 to face the susceptor 12. The gas introduction shower head 32 is connected to an upper electrode high frequency power supply 34 through a matching unit 33. The upper electrode high frequency power supply 34 supplies a predetermined high frequency power to the gas introduction shower head 32, so that the gas introduction shower head 32 serves as an upper electrode. Further, the matching unit 33 functions similarly to the aforementioned matching unit 22.

The gas introduction shower head 32 includes a bottom electrode plate 36 having a plurality of gas holes 35; and an electrode supporting member 37 for detachably supporting the electrode plate 36. Further, in the electrode supporting member 37, there is provided a buffer chamber 38 to which a processing gas supply unit (not shown) is connected via a processing gas inlet pipe 39. A pipe insulator 40 is disposed in the middle of the processing gas inlet pipe 39. The pipe insulator 40 is made of an insulator and serves to prevent a high frequency power supplied to the gas introduction shower head 32 from leaking out to the processing gas supply unit through the processing gas inlet pipe 39. Via the gas holes 35, the gas introduction shower head 32 supplies into the chamber 11 a processing gas fed from the processing gas inlet pipe 39 to the buffer chamber 38.

Further, a loading/unloading port 41 of the wafer W is provided in a sidewall of the chamber 11 at a position corresponding to the height of the wafer W when lifted upward from the susceptor 12 by the pusher pins 31; and a gate valve 42 for opening or closing the loading/unloading port 41 is attached thereto.

In the chamber 11 of the plasma processing apparatus 10, as mentioned above, high frequency powers are applied to the space S between susceptor 12 and the gas introduction shower head 32 by supplying high frequency powers thereto. Hence, the processing gas, which has been supplied through the gas introduction shower head 32, is converted into a high-density plasma in the space S, and therefore, the RIE processing is performed on the wafer W by using the plasma.

Specifically, when the RIE processing is performed on the wafer W in the plasma processing apparatus 10, first, the gate valve 42 is opened to load the wafer W serving as an object to be processed into the chamber 11, and a DC voltage is applied to the electrode plate 23 to absorb and support the loaded wafer W on the adsorption surface 12S. Further, the processing gases (e.g., gaseous mixture formed of $C_4F_8$ gas, $O_2$ gas and Ar gas, having a specified flow rate ratio) are supplied through the gas introduction shower head 32 into the chamber 11 at specified flow rates and flow rate ratio; and, at the same time, the inner pressure of the chamber 11 is set to be kept at a predetermined value by the APC 15 or the like. Still further, high frequency powers are applied to the space S in the chamber 11 by the susceptor 12 and the gas introduction shower head 32. Accordingly, the processing gases introduced through the gas introduction shower head 32 are converted into a plasma to produce ions or radicals in the space S, and the produced radicals or ions are focused on the surface of the wafer W by the focus ring 25 to etch the surface of the wafer W physically or chemically.

Figure 2:
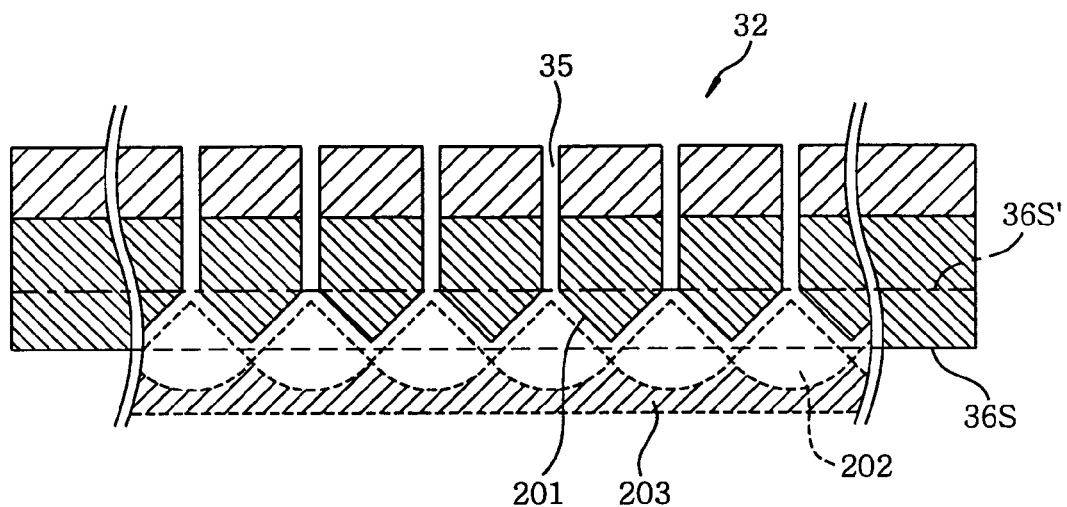
FIG. 2 describes a magnified cross sectional view showing a schematic configuration of a gas introduction shower head shown in FIG. 1, which is cut along a line II-II shown in FIG. 3.
Figure 3:
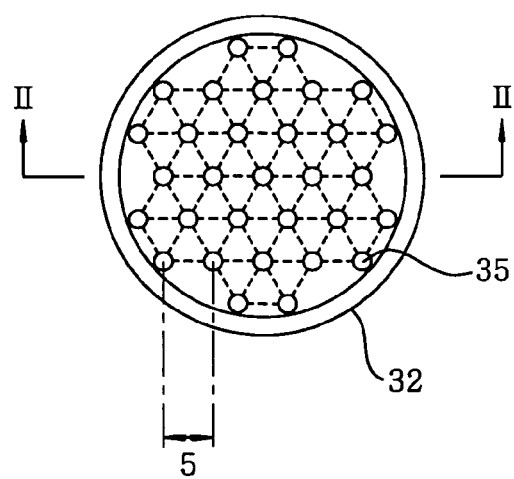
FIG. 3 illustrates a plane view of the gas introduction shower head shown in FIG. 1, which is seen from a chamber-facing portion side.

FIG. 2 is an enlarged cross sectional view showing a schematic configuration of the gas introduction shower head shown in FIG. 1, which is cut along a line II-II shown in FIG. 3.

The gas introduction shower head 32 shown in FIG. 2 has a slant surface 201 at an outer periphery portion of each gas hole 35 at a chamber-facing side. The slant surface 201 has an n-fold rotation symmetry (herein, n is a natural number of 2 or greater), which means that a shape thereof is not changed after it is rotated by $(360/n)°$ about the central axis of the gas hole 35. Namely, even when the slant surface 201 is rotated, a hole is configured to have the same shape as it has before the rotation. In the present embodiment, n is preferably infinity, i.e., the slant surface 201 is of an axial symmetry with respect to the central axis of the gas hole 35, but n may be any natural number of 2 or greater. An inclined angle of the slant surface 201 is 20° with respect to the horizontal direction of FIG. 2, i.e., a surface of the electrode plate 36 facing the space S (hereinafter, referred to as an "space-facing surface" of the electrode plate) 36S. The horizontal dashed line in FIG. 2 represents the plane of the surface 36S prior to forming the slant surfaces. This plane is represented by the dashed lines in FIG. 3 as well. In the example shown in FIGS. 1 and 2, the space-facing surface 36S is parallel to the adsorption surface 12S of the susceptor 12 and normal to the axial direction, i.e., the gas injection direction, of the gas hole 35. Accordingly, the respective gas holes 35 are opened in a cone shape towards the space S. Herein, the processing gas 202 is injected downward (towards the space S) in the drawing through the respective gas holes 35; and a particle cloud 203 is generated where the gas viscous force caused by collisions between the processing gas 202 and the particles in the space S, the ion viscous force caused by collisions between the particles and ions in the space S and the electrostatic force applied to the particles are balanced. Further, the gas holes 35, each having a diameter of 2 mm, are disposed to form a hexagonal shape with a pitch of 5 mm (FIG. 3).

Hereinafter, there will be explained a reason for setting the inclined angle of the slant surface 201 in each gas hole 35 at 20° with respect to the space-facing surface 36S of the electrode plate 36 in the substrate processing apparatus in accordance with the preferred embodiment of the present invention.

Figure 4A:
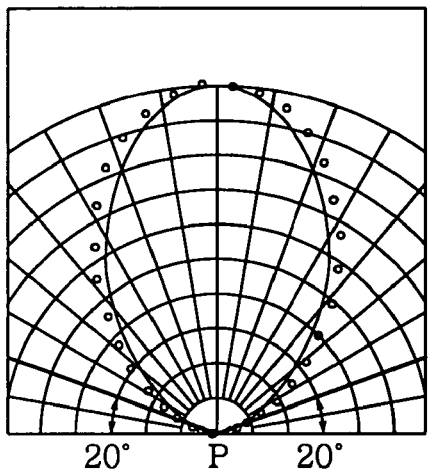
FIGS. 4A to 4D are graphs showing simulation results and measurement results on distributions of gas molecules, injected from a nozzle of a slim line.
Figure 4B:
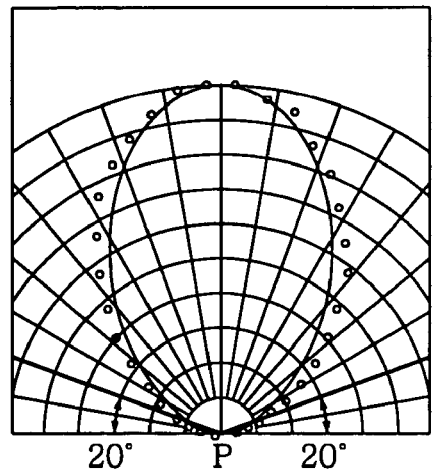
Figure 4C:
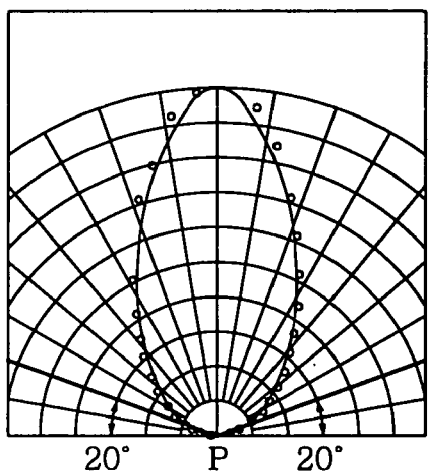
Figure 4D:
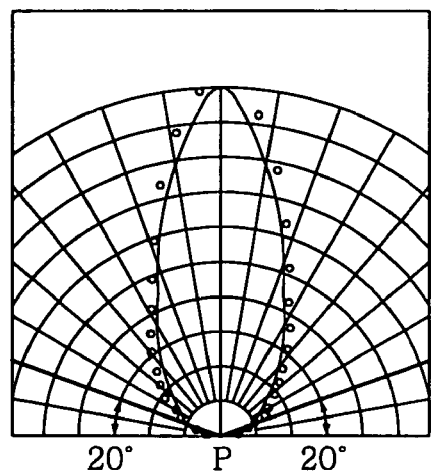

FIGS. 4A to 4D are graphs showing simulation and measurement results on distributions of gas molecules injected from a fine nozzle: FIG. 4A is a case where Knudsen number Kn, i.e., a mean free path of gas molecules divided by a nozzle diameter, is $8.93 \times 10^{-3}$; FIG. 4B, Kn=$8.93 \times 10^{-2}$; FIG. 4C, Kn=0.893; and FIG. 4D, Kn=8.93. The mean free path is a function of average thermal velocity, gas constant, pressure, temperature and gas viscosity; and corresponds to an average distance that a gas molecule travels between collisions with other gas molecules.

In each of the graphs of FIGS. 4A to 4D, a horizontal axis corresponds to a planar surface, and the point "P" on the horizontal axis corresponds to a nozzle P through which the gas molecules are injected. A vertical axis indicates a distance from the planar surface in a space which the planar surface faces, i.e., the space where the gas molecules are injected through the nozzle P. Further, "○" represents a measurement result on gas molecule distribution when nitrogen gas molecules are injected through the nozzle P; and a "near-ellipse" drawn by a solid line represents a simulation result on the gas molecule distribution when nitrogen gas is injected through the nozzle P. The nozzle P injecting the nitrogen gas molecules upward in each graph corresponds to an opening at a position where a vertical inner wall of the gas hole 35 meets the slant surface 201 and the processing gas is injected downward in FIG. 2; and the horizontal axis corresponds to a plane 36S' including the opening in the gas introduction shower head 32.

From the graphs of FIGS. 4A to 4D, it can be seen that regardless of Kn, the gas molecules injected through the nozzle P are distributed in a range of 20° or greater with the nozzle P at the center from the horizontal direction in each of the graphs of FIGS. 4A to 4D in both cases of simulation result and measurement result; and, in a range below 20°, the gas molecules are hardly found. Namely, the flow of the gas in the range below 20° is negligibly small.

Thus, in the gas introduction shower head 32 shown in FIG. 2, the inclined angle of the slant surface 201 at the outer periphery portion of the gas hole 35 is set at 20° with respect to the space-facing surface 36S. Accordingly, it is possible to remove the space where the flow of the processing gas 202 injected through the gas holes 35 is abated, and to supply the processing gas 202 into the space S without leaving it to remain stagnant at the middle positions between the gas holes 35 (hereinafter, simply referred to as "middle positions"). Therefore, it is possible to prevent the particles from being left stagnant at the middle positions. In the same manner, it is also possible to prevent the radicals functioning as precursors from being left stagnant in the middle positions. In this way, the deposits are prevented from being adhered to the middle positions, and therefore, the particles produced by peeling of deposits can be prevented from being adhered onto the wafer W.

Hereinafter, a method for forming the slant surface 201 of the gas hole 35 will be described.

FIGS. 5A to 5D are process diagrams showing a method for forming each gas hole in FIG. 2.

Figure 5A:
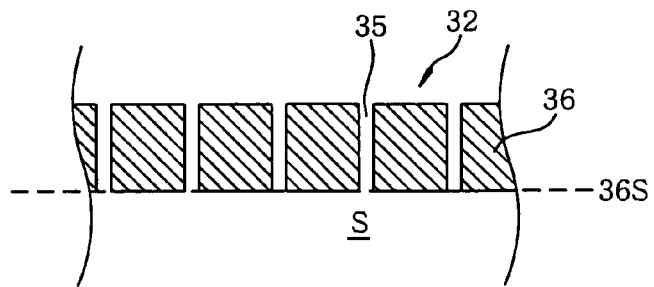
FIGS. 5A to 5D set forth process diagrams showing a method for forming respective gas holes shown in FIG. 2.

First, a plurality of gas holes 35 with a pitch of 5 mm is bored in the electrode plate 36 by using a drill bit of 2 mm in diameter (FIG. 5A). Subsequently, an outer periphery portion of the gas hole 35 at the chamber-facing portion side is cut out by using a countersink drill bit 500 with taper blades of taper angle of about 140°. The countersink drill bit 500 is also provided with a lead guide of about 2 mm diameter extending along a central axis thereof. Specifically, the guide is inserted into the bored gas hole 35 such that the central axis of the drill bit 500 and that of the gas hole 35 are coincided with each other, and the drill bit 500 is pushed upward in the drawing to allow the taper blades thereof to penetrate deeply into the electrode 36. Accordingly, a cone-shaped opening portion is formed towards the space S in the gas hole 35. At this time, since the taper angle of the taper blades of the drill bit 500 is 140°, the inclined angle of the slant surface 201 in the opening portion of the gas hole 35 with respect to the space-facing surface 36S becomes 20° (FIG. 5B).

Figure 5B:
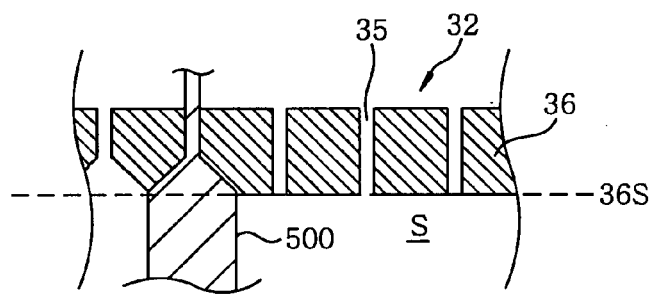
Figure 5C:
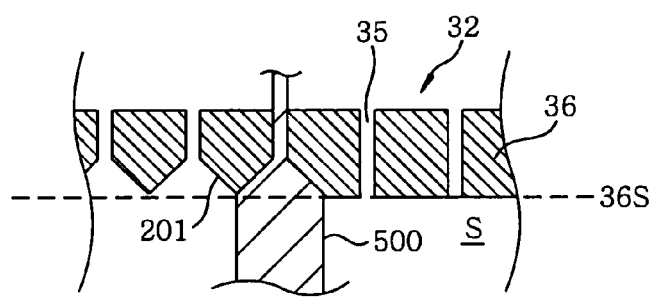
Figure 5D:
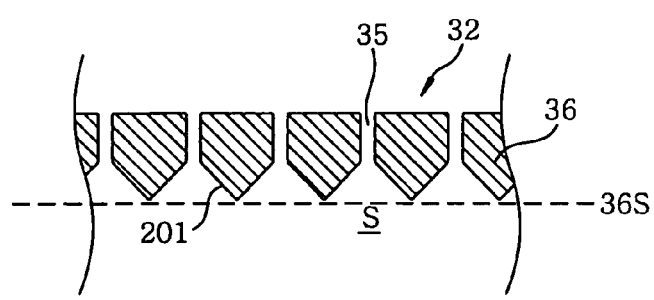

Next, the same processes as in FIGS. 5A and 5B are performed on another gas hole 35 neighboring to that having the cone-shaped opening portion. At this time, the slant surface 201 at the opening portion of the corresponding gas hole 35 is formed such that the space-facing surface 36S is not left between the gas holes 35 (FIG. 5C). The processes described above are repeated until cone-shaped opening portions are formed at all the gas holes 35 and the fabrication of the gas introduction shower head 32 is completed (FIG. 5D).

While the opening portion of the gas hole 35 is formed in a cone shape in the aforementioned embodiment, the gas introduction shower head 32 may be made by engraving V-shaped grooves in a grid pattern, each having an inclined angle of 20°, and boring the gas holes 35 at the intersections of the grooves.

Figure 6A:
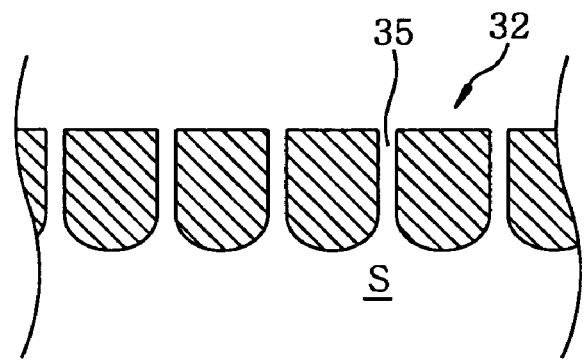
FIGS. 6A and 6B offer magnified cross sectional views showing schematic configurations of modified gas introduction shower heads.
Figure 6B:
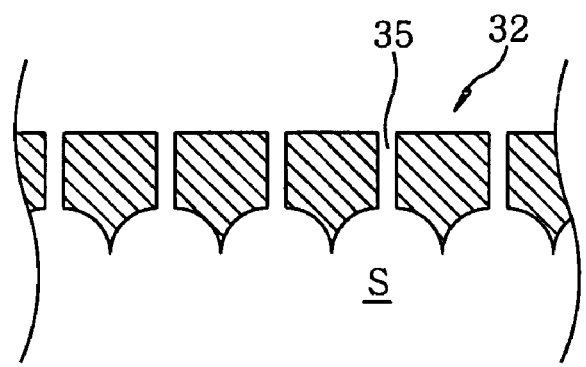

In the aforementioned embodiment, the gas introduction shower head 32 is configured such that a plurality of cone-shaped opening portions is disposed at the chamber-facing portion, but the shape of each opening portion is not limited to the cone shape. For example, as shown in FIG. 6A, the chamber-facing surface between the neighboring opening portions may be shaped as a hemisphere. Further, the opening portion may have a hemisphere shape (FIG. 6B), a quadrangular pyramid shape, a parabola shape, or a combination thereof.

Further, in the aforementioned embodiment, the inclined angle of the slant surface 201 of the gas hole 35 is 20°; but, as can be seen from the graphs of FIGS. 4A to 4D, it needs not to be limited to 20°. It can be 20° or greater.

Figure 7A:
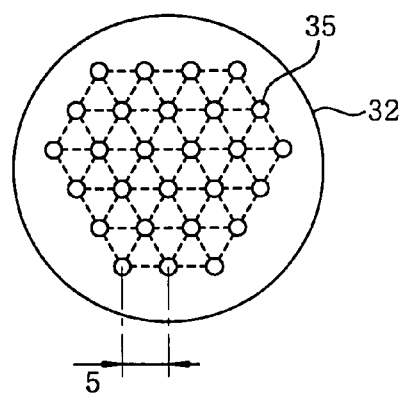
FIGS. 7A to 7G are plane views seen from the chamber-facing surface side of a modified gas introduction shower head.
Figure 7B:
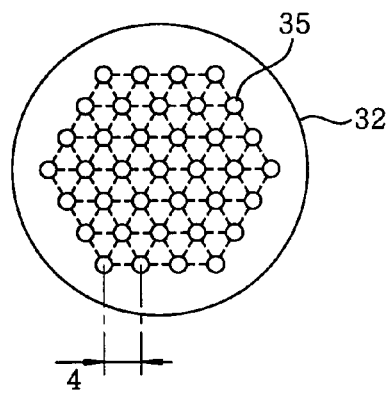
Figure 7C:
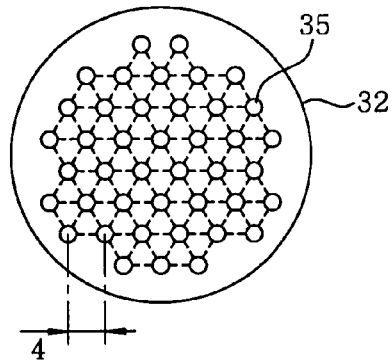
Figure 7D:
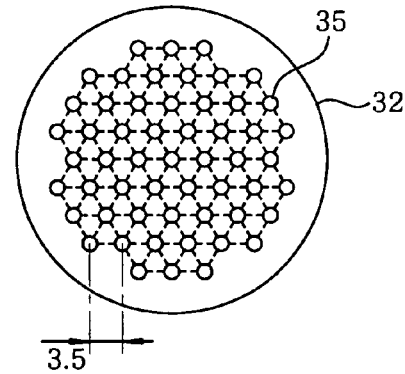
Figure 7E:
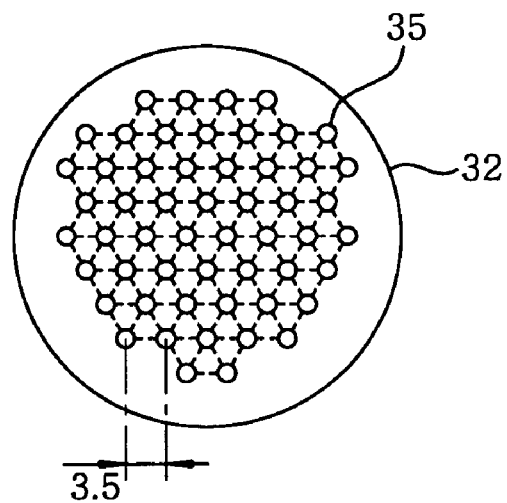
Figure 7F:
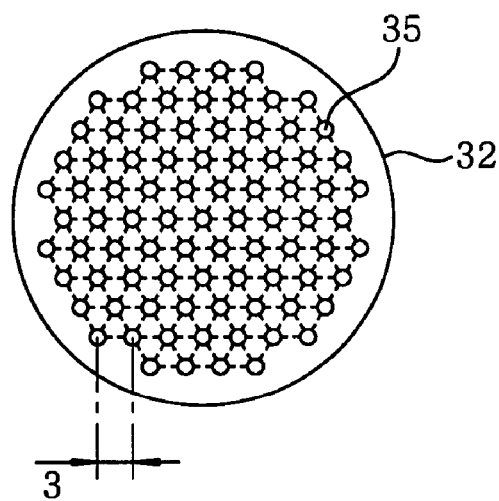
Figure 7G:
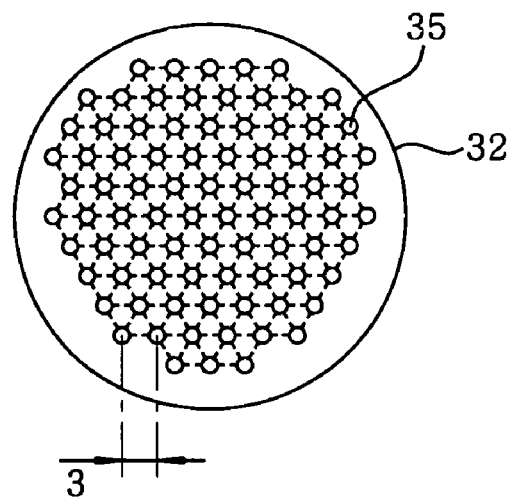
Figure 8:
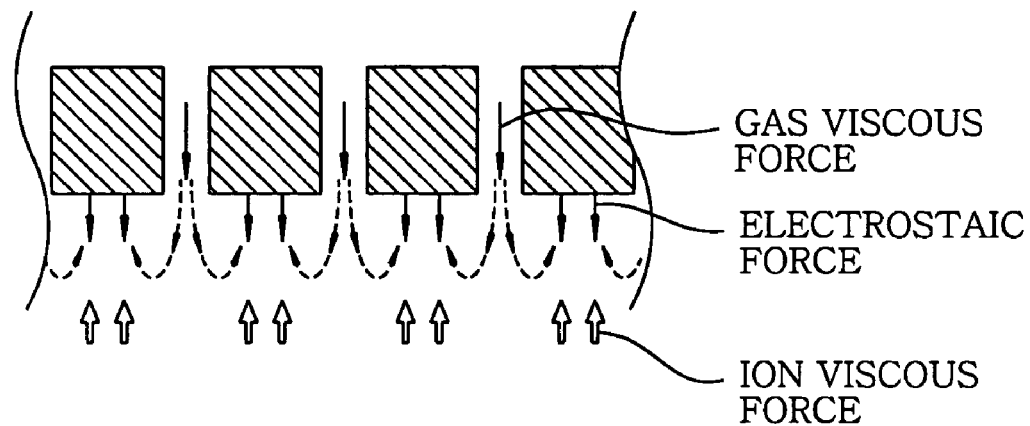
FIG. 8 is a diagram for explaining a gas flow in the chamber of the conventional plasma processing apparatus.
Figure 9:
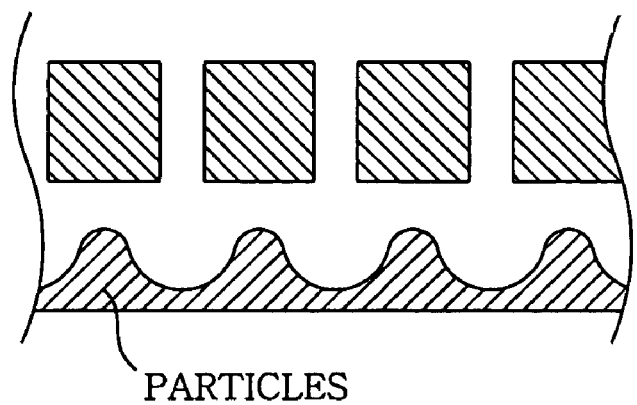
FIG. 9 is a diagram for explaining particles generated in the chamber of the conventional plasma processing apparatus.

Still further, in the aforementioned embodiment, the gas holes 35, each having a diameter of 2 mm, are disposed in the gas introduction shower head 32 with a pitch of 5 mm as shown in FIG. 3, but it is not limited thereto. It can be configured such that the gas holes 35, each having a diameter of 2 mm, are disposed 32 with a pitch of 5 mm as shown in FIG. 7A; the gas holes 35, each having a diameter of 2 mm, are disposed 32 with a pitch of 4 mm (FIGS. 7B and 7C); the gas holes 35, each having a diameter of 1.5 mm, are disposed with a pitch of 3.5 mm (FIGS. 7D and 7E); or the gas holes 35, each having a diameter of 1 mm, are disposed with a pitch of 3 mm (FIGS. 7F and 7G). Among these, the gas introduction shower heads shown in FIGS. 7B to 7G in particular, have the gas holes 35 with smaller pitches and, therefore, these gas introduction shower heads can securely prevent the particles from being left stagnant at the middle positions between the gas holes 35. As with FIG. 3, the dashed lines in FIGS. 7A-7G represent the plane of the surface prior to forming the slant surfaces.

In the aforementioned embodiment, each of the gas holes 35 individually has an opening portion, but opening portions of neighboring gas holes may be connected to form grooves. At this time, a cross sectional shape of a groove is of, e.g., a V-shape, and an outer periphery portion at the chamber-facing side is formed of slant surfaces, which are symmetrically formed at left and right hand sides with respect to a center of the groove. The inclined angle of each slant surface is 20° with respect to the space-facing surface 36S. Further, a plurality of grooves may be concentrically formed with respect to a center of the surface of the electrode plate 36. It is preferable that the grooves are formed without a gap therebetween. Accordingly, it is possible to prevent the particles from being left stagnant between neighboring grooves. The concentric grooves can be readily formed, thereby facilitating the manufacture of the gas introduction shower head 32. Therefore, the manufacturing cost of the gas introduction shower head 32 can be reduced.

In the aforementioned embodiment, the gas introduction shower head 32 includes a plurality of gas holes 35, but it may include a plurality of slit-shaped gas channels (not shown) which are discontinuously arranged, e.g., in a grid pattern or concentrically, to pass through the electrode plate 36 and opened in the space-facing surface 36S. The outer periphery portion of each gas channel at the chamber-facing side also has a slant surface as in the case of the gas hole 35, and an inclined angle of the slant surface is 20° with respect to the space-facing surface 36S. Therefore, the processing gas 202 can be supplied into the space S without being left stagnant. At the same time, since the gas channels can be easily formed, the gas introduction shower head 32 can be readily manufactured, thereby reducing the manufacturing cost thereof.

Further, in accordance with the gas introduction shower head 32 of the present invention, the outer periphery portion of the gas hole 35 is inclined by 20°, so that the processing gas 202 injected through the gas holes 35 can be supplied to every corner of the space S.

While the invention has been shown and described with respect to the preferred embodiment, it will be understood by those skilled in the art that various changes and modifications may be made without departing from the scope of the invention as defined in the following claims.

What is claimed is:

1. A gas supply member for use in a chamber of a plasma processing apparatus, comprising:
   a bottom surface facing an inner space of the chamber; and
   a plurality of gas holes formed in the bottom surface to supply a gas through the gas holes to the inner space,
   wherein an opening portion of each gas hole has a slant surface and all of the bottom surface between neighboring gas holes is formed of only slant surfaces of opening portions of the gas holes, and
   wherein the slant surface includes at least any one of a flat surface and a curved surface.

2. The gas supply member of claim 1, wherein the slant surface includes a coned surface, a spherical surface, a parabolic surface, or a combination thereof.

3. The gas supply member of claim 1, wherein an angle between the slant surface and an imaginary plane perpendicular to a central axis of each gas hole is equal to or greater than that between the imaginary plane perpendicular to the central axis of each gas hole and a distribution of the gas injected through each gas hole.

4. The gas supply member of claim 1, wherein an angle between the slant surface and an imaginary plane perpendicular to a central axis of each gas hole is 20° or greater.

5. The gas supply member of claim 1, wherein the slant surface has an n-fold rotation symmetry about a central axis of each gas hole, n being a natural number greater than 1.

6. A gas supply member for use in a chamber of a plasma processing apparatus, comprising:
   a bottom surface facing an inner space of the chamber;
   a plurality of grooves concentrically formed in the bottom surface; and
   a plurality of gas holes formed in the grooves to supply a gas through the gas holes to the inner space,
   wherein all of the bottom surface between neighboring gas holes is formed of only slant surfaces of the grooves, and
   wherein each of the slant surfaces includes at least any one of a flat surface and a curved surface.

7. The gas supply member of claim 6, wherein each of the slant surfaces includes a cone surface, a spherical surface, a parabolic surface, or a combination thereof.

8. A gas supply member for use in a chamber of a plasma processing apparatus, comprising:
   a bottom surface facing an inner space of the chamber; and
   gas channels, opened at the bottom surface, for supplying a gas into the inner space,
   wherein an opening portion of each gas channel has a slant surface and all of the bottom surface between neighboring gas channels is formed of only slant surfaces of opening portions of the gas channels, and
   wherein the slant surface includes at least any one of a flat surface and a curved surface.

9. The gas supply member of claim 8, wherein the slant surface includes a cone surface, a spherical surface, a parabolic surface, or a combination thereof.

10. The gas supply member of claim 8, wherein each gas channel is of a slit shape.

11. A plasma processing apparatus, which includes a chamber for accommodating therein an object to be processed; and a gas supply member, disposed in the chamber, for supplying a gas into an inner space of the chamber,
   wherein the gas supply member has a bottom surface facing the inner space, and a plurality of gas holes formed in the bottom surface to supply a gas through the gas holes into the inner space,
   wherein an opening portion of each gas hole has a slant surface and all of the bottom surface between neighboring gas holes is formed of only slant surfaces of opening portions of the gas holes, and
   wherein the slant surface includes at least any one of a flat surface and a curved surface.

12. The plasma processing apparatus of claim 11, wherein the slant surface includes a cone surface, a spherical surface, a parabolic surface, or a combination thereof.

* * * * *